United States Patent
Tucker et al.

(10) Patent No.: US 9,246,501 B2
(45) Date of Patent: Jan. 26, 2016

(54) CONVERTER FOR ANALOG INPUTS

(71) Applicant: Honeywell International Inc., Morristown, NJ (US)

(72) Inventors: James L. Tucker, Clearwater, FL (US); Paul S. Fechner, Plymouth, MN (US)

(73) Assignee: Honeywell International Inc., Morris Plains, NJ (US)

( * ) Notice: Subject to any disclaimer, the term of this patent is extended or adjusted under 35 U.S.C. 154(b) by 0 days.

(21) Appl. No.: 14/265,040

(22) Filed: Apr. 29, 2014

(65) Prior Publication Data
US 2015/0311909 A1 Oct. 29, 2015

(51) Int. Cl.
H03M 1/60 (2006.01)
H03M 1/00 (2006.01)
H03M 1/06 (2006.01)
H03M 1/12 (2006.01)

(52) U.S. Cl.
CPC ............ H03M 1/002 (2013.01); H03M 1/0621 (2013.01); H03M 1/122 (2013.01); H03M 1/60 (2013.01)

(58) Field of Classification Search
CPC .......... H03M 1/60; H03M 1/50; H03M 1/502
USPC ........................................................ 341/157
See application file for complete search history.

(56) References Cited

U.S. PATENT DOCUMENTS

| | | |
|---|---|---|
| 3,868,677 A * | 2/1975 | Kidd .............................. 341/157 |
| 4,227,182 A | 10/1980 | Ogasawara et al. |
| 4,572,954 A | 2/1986 | Josephson et al. |
| 4,593,384 A | 6/1986 | Kleijne |
| 5,117,457 A | 5/1992 | Comerford et al. |
| 5,173,609 A | 12/1992 | Lacoste et al. |
| 5,309,387 A | 5/1994 | Mori |
| 5,389,738 A | 2/1995 | Piosenka et al. |
| 5,712,973 A | 1/1998 | Dayan et al. |
| 5,795,068 A | 8/1998 | Conn, Jr. |
| 5,895,629 A * | 4/1999 | Russell et al. .................. 422/94 |
| 6,246,970 B1 | 6/2001 | Silverbrook et al. |

(Continued)

FOREIGN PATENT DOCUMENTS

| | | | |
|---|---|---|---|
| JP | 63135023 A | * | 6/1988 |
| JP | 01058124 A | * | 3/1989 |

(Continued)

OTHER PUBLICATIONS

"In-Chip Anti-Tamper Sensor Technology (ICAT)," retrieved from http://web.archive.org/web/20090206110545/http://accordsol.com/ICAT.html, Feb. 6, 2009, 6 pp.

(Continued)

*Primary Examiner* — Howard Williams
(74) *Attorney, Agent, or Firm* — Shumaker & Sieffert, P.A.

(57) ABSTRACT

A device having a first oscillator circuit configured to generate a first signal with a first frequency based on an analog input and external characteristics, and a second oscillator circuit configured to generate a second signal with a second frequency based on a constant voltage and the external characteristics. The device also having one or more discrete logic gates configured to generate a digital composite signal based on the first signal and the second signal, such that a number of transitions in the digital composite signal over a period of time, based on the first frequency of the first signal, are indicative of the analog input.

20 Claims, 5 Drawing Sheets

(56) References Cited

U.S. PATENT DOCUMENTS

| | | |
|---|---|---|
| 6,388,574 B1 | 5/2002 | Davis et al. |
| 6,421,213 B1 | 7/2002 | Blyth |
| 6,895,509 B1 | 5/2005 | Clark |
| 6,948,388 B1 | 9/2005 | Clayton et al. |
| 7,188,282 B2 | 3/2007 | Walmsley |
| 7,215,212 B2 | 5/2007 | Mahony et al. |
| 7,265,639 B2 | 9/2007 | Bhushan et al. |
| 7,472,305 B1 | 12/2008 | Hershman et al. |
| 7,495,519 B2 | 2/2009 | Kim et al. |
| 7,498,644 B2 | 3/2009 | Shapiro et al. |
| 7,646,254 B2 | 1/2010 | Kantor et al. |
| 7,718,963 B2 | 5/2010 | Seefeldt et al. |
| 7,750,305 B2 | 7/2010 | Solf et al. |
| 7,795,087 B2 | 9/2010 | Roizin et al. |
| 7,800,156 B2 | 9/2010 | Roizin et al. |
| 7,837,110 B1 | 11/2010 | Hess et al. |
| 7,906,805 B2 | 3/2011 | Sadd et al. |
| 7,978,556 B2 | 7/2011 | Macerola et al. |
| 8,004,306 B2 | 8/2011 | Takahashi et al. |
| 8,421,663 B1 | 4/2013 | Bennett |
| 8,575,560 B1 | 11/2013 | Fechner |
| 8,614,637 B2 * | 12/2013 | Ito .................................. 341/155 |
| 2003/0155903 A1 | 8/2003 | Gauthier et al. |
| 2004/0017224 A1 | 1/2004 | Tumer et al. |
| 2006/0273831 A1 | 12/2006 | Maksimovic et al. |
| 2007/0255966 A1 | 11/2007 | Condorelli et al. |
| 2008/0114582 A1 | 5/2008 | Leterrier et al. |
| 2010/0090714 A1 | 4/2010 | Van Geloven et al. |
| 2010/0096556 A1 | 4/2010 | Arsalan et al. |
| 2010/0225380 A1 | 9/2010 | Hsu et al. |
| 2011/0147806 A1 | 6/2011 | Wilson et al. |
| 2012/0075137 A1 | 3/2012 | Tanizawa |

FOREIGN PATENT DOCUMENTS

| | | |
|---|---|---|
| KR | 20100062652 A | 6/2010 |
| WO | 02079803 A1 | 10/2002 |
| WO | 2013030466 A1 | 3/2013 |

OTHER PUBLICATIONS

Carbonetto, S. et al., "Ring Oscillators Response to Irradiation and Application to Dosimetry," Proceedings of the Argentine School of Micro-Nanoelectronics, Technology and Applications, Oct. 1-2, 2009, 4 pp.

Neve, M. et al., "Memories: A Survey of Their Secure Uses in Smart Cards," Second IEEE International Security in Storage Workshop, Oct. 31, 2003, 10 pp.

Extended Search Report from counterpart European Application No. 15163296.5, dated Sep. 30, 2015, 13 pp.

* cited by examiner

CONVERTER FOR ANALOG INPUTS

TECHNICAL FIELD

This disclosure relates to determining values of analog inputs, and more particularly, to determining values of analog inputs from a sensor.

BACKGROUND

In various applications, it is important to sense or measure any of various types of natural or artificial phenomena, such as radiation to which a device or product has been exposed. This may be the case in electronic, medical, food safety, and space applications, for example. One application may be for assurance that medical devices or foods have received the correct dose of radiation to ensure that the medical device has been fully sterilized. Another application may be for assurance that all pathogens leading to further degradation have been exterminated from the food.

SUMMARY

In general, the disclosure is directed to techniques and devices that convert an analog input into a digital input with minimal power and minimal profile. For example, a sensor may convert a sensed input into an analog input (e.g., voltage input). The sensor may apply the analog input to a first oscillator, which sets the frequency of the signal generated by the first oscillator. In this example, a second oscillator substantially similar to the first oscillator may generate a signal that oscillates at a constant frequency and the second oscillator acts as a reference oscillator to the first oscillator.

In this example, the first and second oscillator will each produce a digital signal, such that the first signal from the first oscillator is based on the analog input and the external circumstances, and the second signal from the second oscillator is based on a constant voltage and the external circumstances. Because the first digital signal is based on the analog input and the external circumstances and the second digital signal is based on the constant voltage and the external circumstances, the frequencies of the first and second signals may be different. As both the first and second oscillators are substantially similar and will experience the same external circumstances (e.g., heat, aging, or the like), using the second oscillator as a reference for the first oscillator, it may be possible to nearly eliminate potential errors in determining the value of the analog input caused by external circumstances. For example a converter may combine the two digital signals with two different frequencies into a digital composite signal with a number of transitions indicative of the analog input. Optionally, frequency dividers may be used to increase the difference in frequencies between the first and second digital signals, providing a higher resolution for the number of transitions to be indicative of the analog input.

In one example, the disclosure is directed to a device that comprises a first oscillator circuit configured to generate a first signal with a first frequency based on an analog input and external characteristics, a second oscillator circuit configured to generate a second signal with a second frequency based on a constant voltage and the external characteristics, and one or more discrete logic gates configured to generate a digital composite signal based on the first signal and the second signal, wherein a number of transitions in the digital composite signal over a period of time are indicative of the analog input, and wherein the period of time is based on one of the first frequency of the first signal or the second frequency of the second signal.

In another example, the disclosure is directed to a method that comprises generating, by a first oscillator circuit, a first signal with a first frequency based on an analog input and external characteristics, generating, by a second oscillator circuit, a second signal with a second frequency based on a constant voltage and the external characteristics, and generating, by one or more discrete logic gates, a digital composite signal based on the first signal and the second signal, wherein a number of transitions in the digital composite signal over a period of time are indicative of the analog input, and wherein the period of time is based on one of the first frequency of the first or the second frequency of the second signal.

In another example, the disclosure is directed to a system that comprises a first oscillator circuit configured to generate a first signal with a first frequency based on an analog input and external characteristics, a second oscillator circuit configured to generate a second signal with a second frequency based on a constant voltage and the external characteristics, one or more discrete logic gates configured to generate a digital composite signal based on the first signal and the second signal, wherein a number of transitions in the digital composite signal over a period of time are indicative of the analog input, and wherein the period of time is based on one of the first frequency of the first or the second frequency of the second signal, and a processor configured to determine the analog input based on the number of transitions in the digital composite signal.

The details of one or more examples of the disclosure are set forth in the accompanying drawings and the description below. Other features, objects, and advantages of the disclosure will be apparent from the description and drawings, and from the claims.

DETAILED DESCRIPTION

Figure 1:
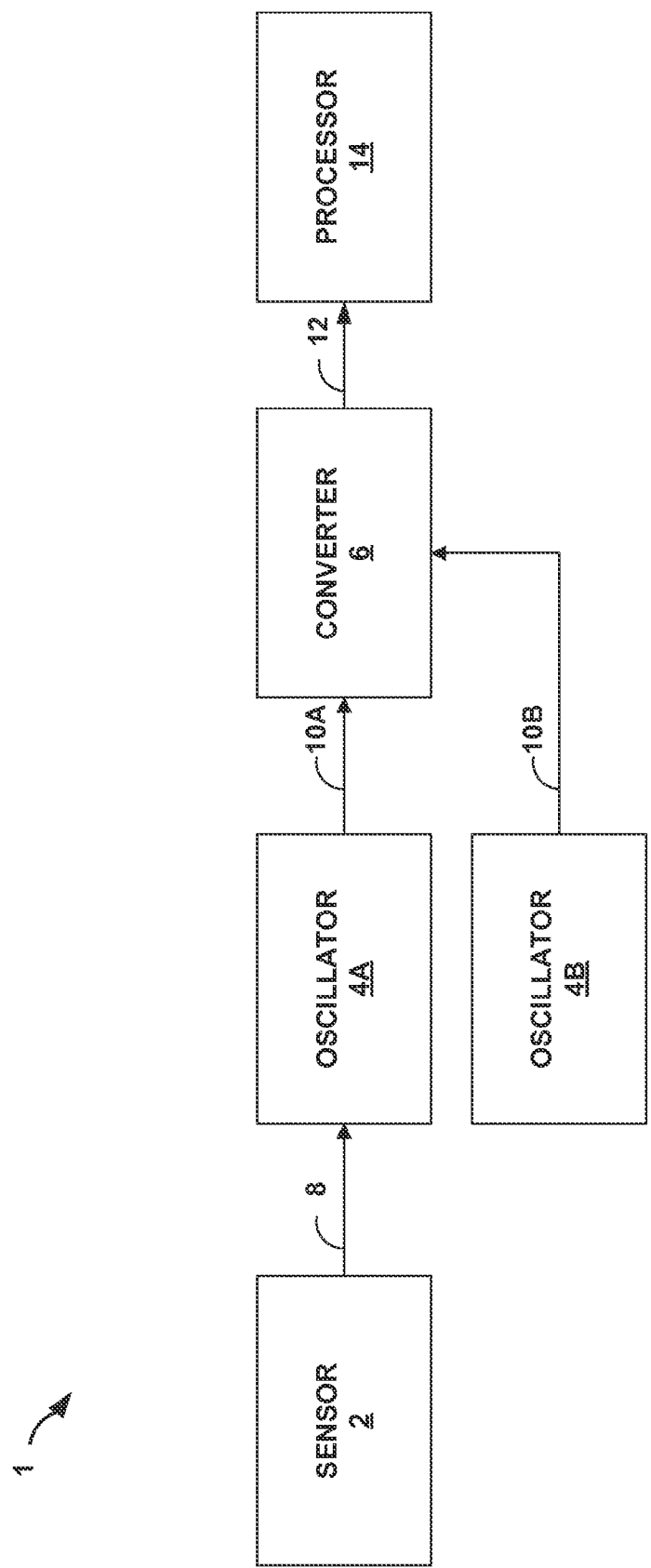
FIG. 1 is a block diagram illustrating an example of an analog signal converter that implements one or more example techniques described in this disclosure.

Some of the examples described in the disclosure may be directed to devices, methods, and systems for converting the analog output of a sensor, such as a radiation sensor, into a high resolution digital signal, where the number of transitions of the digital signal is indicative of the analog output of the sensor. In various examples, an analog signal converter as described herein may be implemented entirely in complementary metal-oxide-semiconductor (CMOS) circuitry that may be incorporated in any CMOS integrated circuit. In some examples, an analog signal converter as described herein may receive and convert one or more analog inputs, such as radiation exposure of an integrated circuit, and compensating for any affects that the external circumstances (e.g., heat, aging, or the like) have on the measurement of the input value. In some examples, the integrated circuit may incorporate an analog signal converter, such that when it is powered up or at any time thereafter, may automatically convert the analog input (e.g., a voltage varied by the amount of radiation exposure) from a sensor (e.g., a radiation sensor), and output a digital output indicative of the voltage from the analog sensor. An analog signal converter may be implemented as a portion of a larger integrated circuit, and may therefore be implemented with a small profile and low cost, in comparison to using an analog-to-digital converter.

In general, analog inputs are continuous physical quantities that cannot be used as digital inputs until the analog inputs are each converted into a digital input, which is a digital number that represents the quantity's amplitude. However, the conversion of the analog inputs requires quantization, which introduces a small amount of error. To reduce the amount of error by the quantization, the analog inputs are typically sampled over a period of time, which results in a sequence of digital value that have converted a continuous-time and continuous amplitude analog signal to a discrete-time and discrete amplitude digital signal.

One technique used to convert analog signals to digital signals is through an analog-to-digital converter (ADC). An ADC is defined by the range of frequencies the ADC can measure (e.g., "bandwidth") and how accurately the ADC can measure a signal relative to the noise it introduces. The actual bandwidth of an ADC is limited primarily by its sampling rate, and how the ADC handles errors such as aliasing. The dynamic range of the ADC is often described in terms of effective number of bits, which is the number of bits of each measure the ADC returns that are on average not noise. For example, an ideal ADC has effective number of bits equal to the resolution of the ADC. However, real-world ADCs are often selected to match the bandwidth and required signal to noise ratio of the signal to be quantized. Matching an ADC is required as the ADC is generally limited by the number of bits at the output, while also requiring more power and a larger profile. In systems and devices with profile and power limitations, ADCs may provide only a limited resolution or may not work at all.

Techniques and devices disclosed herein provide for an analog signal converter with low power and high resolution conversion of analog inputs to a digital output, and available to systems and devices with profile and power constrains. In one example of this disclosure, a device may have a first oscillator circuit configured to generate a first signal with a first frequency that is based on an analog input and external characteristics, a second oscillator circuit configured to generate a second signal with a second frequency that is based on a constant voltage and the external characteristics, and one or more discrete logic gates configured to generate a digital composite signal based on the first signal and the second signal, wherein a number of transitions in the digital composite signal over a period of time, based on the first frequency of the first signal, are indicative of the analog input. The digital composite signal of this device should not be confused with a beat frequency, as the beat frequency is an analog signal equal to the absolute value of the difference in frequency of the two waves. Whereas the digital composite signal is a digital signal, and may represent the logical expression of a low logic state for any external low logic states, and provides a high logic state only when there are external high logic states.

One advantage of the techniques and devices as disclosed is high-resistance to external characteristics from the environment, such as heat, radiation, and the like. For example, the device could use one ring oscillator to convert the analog input into a digital output; however, one ring oscillator would also be susceptible to external circumstances. As such, two substantially similar oscillators may be used to negate the external circumstances, such as one ring oscillator based on the analog input and the external circumstances, and a second ring oscillator based on a constant voltage (e.g., reference voltage) and the external circumstances. Another advantage of the techniques and devices as disclosed is high resolution of the analog input, which may also be adjustable by the use of optional frequency dividers. For example, the lower the frequency of the first digital signal compared to the frequency the second digital signal (e.g., achieved through frequency dividers, or varying the base frequency of the two oscillators) the more transitions will be available to a processor. In this example, the number of transitions available to the processor is flexible and adjustable, based on the difference and/or ratio between the frequencies, and can result in an extremely high number of transitions in comparison to conventional ADCs. Another advantage of the techniques and devices as disclosed is the compact profile of the device and/or system, which requires a low amount of power and manufacturing cost. For example, the device may have two substantially similar matched ring oscillator circuits on the same silicon device, such that any chip-to-chip variation of one ring oscillator circuit on the silicon device will also apply to the other ring oscillator circuit on the same silicon device preventing any errors from internal circumstances (e.g., manufacturing defects) from occurring at the output. Another advantage of the techniques and devices as disclosed is the use of a zero transitions for a period, and a number of transitions for another period, which allows the need for one output pin instead of requiring more than one output pin. For example, through a single output pin a processor may count the number of transitions between the periods of zero transitions allowing to the processor to determine the digital input corresponding to the analog input. Another advantage of the techniques and devices as disclosed is the flexibility of changing the respective values of each divider. For example, for a low power application, the value of the first and second dividers may be increased to provide a lower frequency and a lower number of transitions, and conversely, for a high power application, the value of the first divider may be increased while the value of the second divider may be decreased to provide a higher frequency and a higher number of transitions at the output.

FIG. 1 is a block diagram illustrating an example of analog signal converter 1 that implements one or more example techniques described in this disclosure. In the example of FIG. 1, analog signal converter 1 includes sensor 2, oscillators 4A and 4B, converter 6, links 8-12, and processor 14.

Sensor 2 represents any analog sensor, such as a radiation sensor, which outputs an analog output to be received by oscillator 4A as an analog input. Oscillators 4A and 4B represent a component (e.g., non-linear oscillator, or any component(s) capable of generating a signal at particular frequency that can drive a frequency divider), such as a ring oscillator that generates a signal at a particular frequency proportional to a voltage applied to oscillators 4A and 4B. In some examples, a gain (e.g., "sensitivity") of oscillators 4A and 4B determines the particular frequency of the signal based on the applied voltage. For instance, a ring oscillator is a component composed of a chain of odd number of NOT gates (e.g., inverters), where the output of the last NOT gate feeds back to the input of the first NOT gate. Due to the odd number of NOT gates in the chain, the output of the chain of NOT gates oscillates between two voltage levels (e.g., a digital high and a digital low).

In some examples, a ring oscillator only requires power to operate above a certain threshold voltage, and oscillations begin spontaneously. In other examples, to increase the frequency associated with the signal generated by the oscillator, the applied voltage may be increased, which increases both the frequency of the signal generated by the oscillator and the current consumed. In yet other examples, to increase the frequency associated with the signal generated by the ring oscillator, a smaller number of inverters may result in a higher frequency of oscillation given a certain power consumption. In some examples, the first and second oscillators may each generate a signal oscillating at a frequency of 1 gigahertz (GHz). In some examples, the first and second oscillators may have an odd number of inverters, where the last inverter is a NOR gate. In this example, the NOR gate may allow the first and/or second oscillator circuit to be disabled by a disable input received by the last inverter (e.g., NOR gate).

Converter 6 represents the conversion of digital signals (e.g., oscillating digital highs and lows) produced by oscillators 4A and 4B to generate a digital composite signal. In some examples, oscillator 4A may generate a first signal with a first frequency and oscillator 4B may generate a second signal with a second frequency. In other examples, converter 6 may also include two optional frequency dividers, such that the output of each oscillator circuit is an input into their respective frequency divider. The two optional frequency dividers may receive the input of the first signal with the first frequency and the second signal with the second frequency from oscillators 4A and 4B, and generate a third signal with a third frequency and a fourth signal with a fourth frequency, respectively. Converter 6 may also include an AND gate, such that the output (e.g., the first and second signals, the third and fourth signals) of either oscillators 4A and 4B or the two frequency dividers is received by the AND gate and the output of the AND gate is a digital composite signal (e.g., a combination of either the first and second signals or the third and fourth signals to produce a single digital composite signal).

Links 8-12 may represent any medium capable of conducting electrical power from one location to another. Examples of links 8, 10A and 10B, and 12 include, but are not limited to, physical and/or wireless electrical transmission mediums such as electrical wires, electrical traces, RF transmissions, and the like. Each of links 8, and 10A and 10B provide electrical coupling between, respectively, sensor 2 and oscillators 4A, oscillators 4A and 4B, and converter 6. Link 8 provides electrical coupling between sensor 2 and oscillator 4A, such that sensor 2 sends commands to oscillator 4A in order to regulate the oscillation of oscillator 4A to be delivered to converter 6. Links 10A and 10B provide electrical coupling between oscillators 4A and 4B and converter 6, such that oscillator 4A sends a digital frequency to converter 6 based on the input received by oscillator 4A, and oscillator 4B sends a digital reference frequency to converter 6 in order to regulate the errors created by external circumstance, such as the environment. Link 12 provides electrical coupling between converter 6 and an integrated circuit, such as an input-output (I/O) device (not shown), such that converter 6 sends a composite digital signal to the integrated circuit in order to provide information regarding the analog input received from sensor 2, such as the amount of radiation exposure sensed by a radiation sensor. In some examples, the information provided by the composite digital signal is the number of transitions in the composite digital signal over a period of time, and the number of transitions is indicative of the amount of radiation exposure as sensed by sensor 2. In some examples, the frequency of the digital composite device to the I/O device may be dependent on the power constraints.

Processor 14 may represent any digital component capable of counting the length of a primary transitions and the number of secondary transitions in the primary transition, In some examples, processor 14 may be one of a microprocessor, an application-specific instruction-set processor, a digital signal processor, a counter, or the like.

In some examples, the base frequency of the first digital signal and the second digital signal is 1 GHz. In other examples, the base frequency of the first digital signal and the second digital signal are varied and the base frequencies are not divided by frequency dividers. In yet other examples, the base frequency of the first digital signal and the second digital signal are 1 GHz, and the base frequencies are divided by a value with frequency dividers. In this example, a higher number of transitions indicative of the analog input may be achieved through the difference and/or ratio between the values of the frequency dividers.

Figure 2:
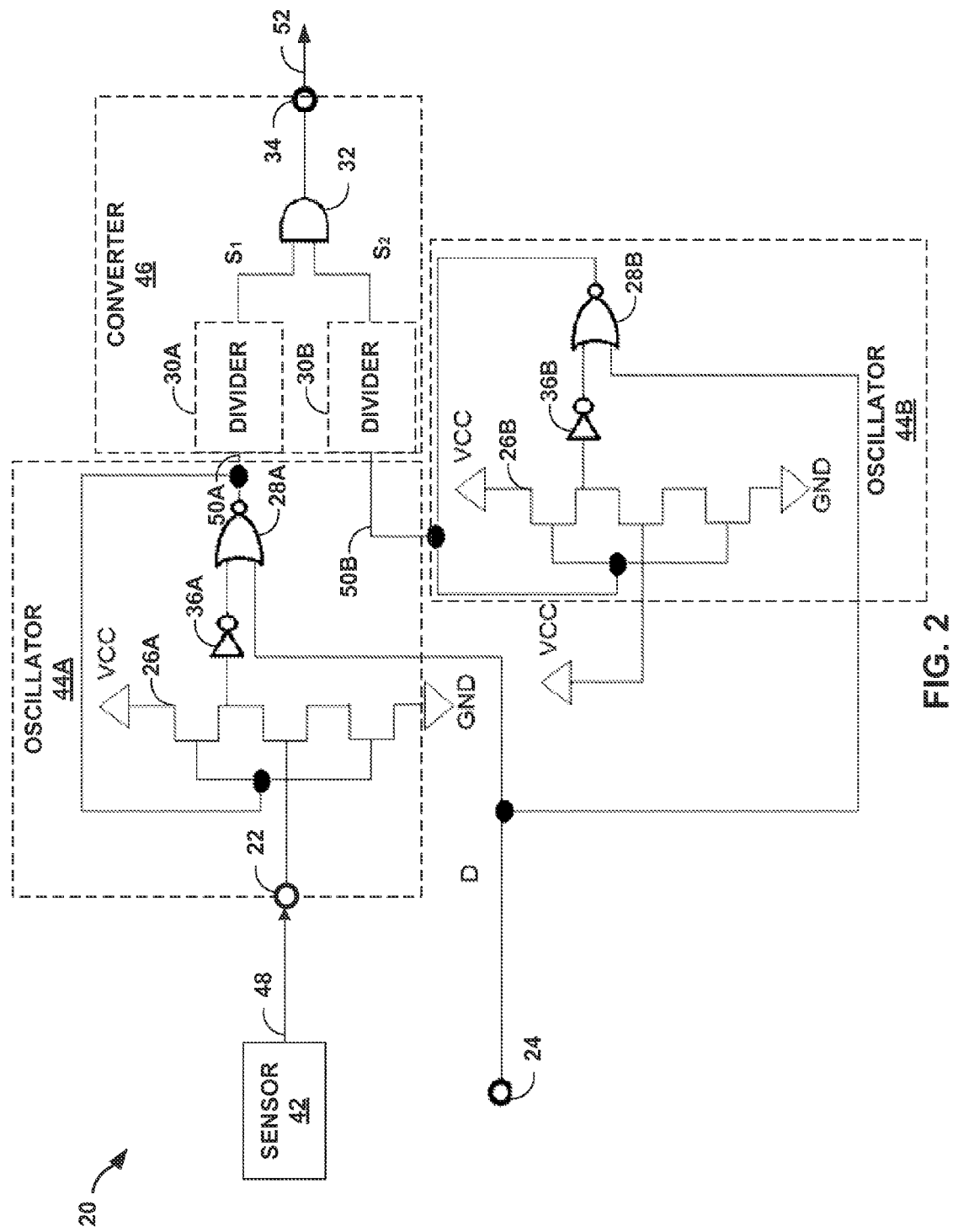
FIG. 2 is a circuit diagram illustrating an example an analog signal converter that implements one or more example techniques described in this disclosure.

FIG. 2 is a circuit diagram illustrating an example analog signal converter 20 with two ring oscillators 46A and 46B. In the example of FIG. 2, analog signal converter 20 includes sensor 42, oscillators 44A and 44B, converter 46, and links 48-52, which may correspond to sensor 2, oscillators 4A and 4B, converter 6, and links 8-12, as described in FIG. 1. In the example of FIG. 2, oscillator 44A includes sensor input 22 via link 48, disable input 24, ring oscillator 26A, inverter 36A, NOR gate 28A, and link 50A In the example of FIG. 2, oscillator 44B includes disable input 24, ring oscillator 26B, inverter 36B, NOR gate 28B, and link 50B. In the example of FIG. 2, converter 46 includes optional dividers 30A and 30B, output signals S1 and S2, AND gate 32, and digital frequency output 34 over link 52.

Input terminal 22 represents an input terminal (e.g., a charge input) for receiving and/or providing an analog input, such as an analog input from sensor 42 to oscillator 44A. Disable input 24 represents an input terminal and may receive and/or provide a digital high to NOR gates 28A and 28B, such that the output of ring oscillators 26A and 26B will not become a digital high at the output of NOR gates 28A and 28B. In the alternative, disable input 24 may receive and/or provide a digital low to NOR gates 28A and 28B, such that the output of ring oscillators 26A and 26B may become either a digital high or a digital low at the output of NOR gates 28A and 28B, thereby enabling NOR gates 28A and 28B to provide the generated signals of ring oscillators 26A and 26B.

Ring oscillators 26A and 26B represent a chain of an odd number of inverters that oscillate continuously. In some examples, ring oscillators 26A and 26B may oscillate around 1 gigahertz (GHz). In some examples, only ring oscillator 26B may oscillate around 1 GHz. In some examples, ring oscillators 26A and 26B may be an n+2 ring oscillator, such that ring oscillators 26A and 26B may be an odd number (e.g., n, which is an odd number) of inverters connected to two additional inverting discrete logic gates, such as inverters 36A and 36B, and NOR gates 28A and 28B. In some examples, ring oscillators 26A and 26B may each have a respective gain that generates a signal at a particular frequency based on the applied voltage.

Inverters 36A and 36B represent discrete logic gates (e.g., a NOT gate), which provide a logic negation between the external logic state and the internal logic state. NOR gates 28A and 28B represent a combination of two discrete logic gates, that is an OR gate and a NOT gate, which provides an internal low logic state for any external high logic states, and alternatively, provides an internal high logic only when there are external low logic states.

Dividers 30A and 30B are optional and represent frequency dividers, which receive an input signal with an associated frequency and divide the frequency by a specific value, before generating an output signal with the divided frequency of the input signal. In some examples, dividers 30A and 30B may have different values tier dividing their respective input signals. In some examples, the value of divider 30A may be $2^n$ (e.g., $2^{16}$ or 16 bits, or $2^{30}$ or 30 bits), and the value of divider 30B may be $2^x$ (e.g., $2^7$ or 7 bits, or $2^{10}$ or 10 bits). In some examples, the difference and/or ratio of the value of divider 30A and the value of divider 30B may determine the base number of secondary transitions (e.g., clock edges, $T_2$ as described in FIG. 3) inside of a half period of a primary transition (e.g., $T_1$ as described in FIG. 3) in the digital composite signal. In some examples, if the value of divider 30A is ten bits greater than the value of divider 30B, then the frequency of digital output signal $S_1$ is ten times (e.g., 10 bits) longer the digital output signal $S_2$. In some examples, where the frequencies applied to both divider 30A and 30B are equal (e.g., where the voltage applied to both oscillators 4A and 4B are equal), the number of transitions (e.g., number of bits at the output) may depend on the difference between the number of bits of divider 30A and the number of bits of divider SOB (e.g., n-x, $2^{16-7}$ or $2^{30-10}$).

Output signal $S_1$ represents a digital output signal with an associated frequency from either oscillator 44A or from optional divider 30A. In some examples, $S_1$ may represent a signal with a frequency of 1 GHz. In other examples, $S_1$ may represent a signal with a frequency based on the analog input. In yet other examples, $S_1$ may represent a signal with a frequency based on the analog input and divided by a value (e.g., a value of $2^n$ or $2^{16}$).

Output signal $S_2$ represents a digital output signal with an associated frequency from oscillator 44B or from optional divider 30B. In some examples, $S_2$ may represent a signal with a frequency of 1 GHz. In other examples, $S_2$ may represent a signal with a frequency of 1 GHz and divided by a value (e.g., a value of $2^x$ or $2^7$).

AND gate 32 represents a discrete logic gate, which provides an internal low logic state for any external low logic states, and provides an internal high logic state only when there are external high logic states. Output terminal 34 represents an output terminal and may output a digital composite signal from AND gate 32 to a processor (e.g., processor 14 as described in FIG. 1) over link 52.

In the example of FIG. 2, an analog input (e.g., voltage) is received over link 48 at input terminal 22. In some examples, the analog input is from sensor 42. In some examples, the analog input is a voltage based on the amount of radiation detect by sensor 42. In some examples, an analog-to-digital converter (ADC) may have a large profile, require more power, and may have a limited resolution at the digital output.

After receiving the analog input (e.g., voltage), the analog input causes an increase or decrease in the frequency associated with the output signal (e.g., $S_1$) generated by ring oscillator 26A with respect to the signal generated by oscillator 44B. In some examples, after receiving the analog input (e.g., voltage), a resistor and one or more capacitors may condition the signal to be applied to ring oscillator 26A, and the voltage across a second capacitor may be applied to ring oscillator 26A. In some examples, a single ring oscillator may be exposed to external circumstances that may alter the digital output of the single ring oscillator, but two substantially similar oscillators, such as oscillator 44A and oscillator 44B, will affected by external circumstances in a similar manner. In some examples, oscillators 44A and 44B will be on the same silicon chip. In some examples, NOR gate 28A may receive a digital high input from disable input 24, which disables the output signal with the associated frequency indicative of the analog input (e.g., $S_1$) from oscillator 44A.

In the example of FIG. 2, a constant voltage (e.g., a supply voltage of the circuit Vcc) is received by ring oscillator 26B, which as described above causes ring oscillator 26B to generate an output signal with a constant associated frequency (e.g., $S_2$). In some examples, the difference and/or ratio in frequencies between output signal $S_r$ from oscillator 44A and output signal $S_2$ from oscillator 44B will provide information on the difference in voltage relative to Vcc with respect the analog input voltage, and the impact of the external circumstances will be canceled out as both oscillators 44A and 44B are similarly affected. In some examples, NOR gate 28B may receive a digital high input from disable input 24, which disables the output signal with the constant associated frequency (e.g., $S_2$) from oscillator 44B. In some examples, the constant associated frequency is 1 GHz.

In one example of FIG. 2, AND gate 32 may receive and combine digital output signals $S_1$ and $S_2$ to generate a composite digital signal, such that the composite digital signal contains a number of transitions. In sortie examples, this combination could be a logic function (e.g., software implementing logic combinations), or a combination of one or more discrete logic gates (e.g., AND gates, OR gates, NAND gates, NOR gates, etc.), in some examples, the digital composite signal may be provided to a processor (e.g., processor 14 as described in FIG. 1) over link 52, and the processor determines the number of transitions in the digital composite signal. In other examples, the digital composite signal may be provided to a counter over link 52, and the counter determines the number of transitions in the digital composite signal.

In another example of FIG. 2, divider 30A may receive the digital output signal with an associated frequency indicative of the analog input from oscillator 44A, and divides the frequency of the digital output signal by a value. In some examples, the value is $2^n$ (e.g., $2^{16}$ or $2^{30}$, etc.). After dividing the associated frequency indicative of the analog input by the value, divider 30A may generate another digital output signal with a divided associated frequency indicative of the analog input (e.g., $S_1$). Divider 30B may also receive the digital output signal with an associated constant frequency from oscillator 44B, and divides the frequency of the digital output signal by a value. In some examples, the value is $2^x$ (e.g., $2^7$ or $2^{10}$, etc.). After dividing the associated constant frequency, divider 30B may generate another digital output signal with a divided associated constant frequency (e.g., $S_2$). Alternatively in this example, dividers 30A and 30B may not be used, but instead the base frequencies of digital output signals $S_1$ and $S_2$ may vary in similar manner and/or ratio as the frequencies of divided digital output signals $S_1$ and S7 as described above.

Figure 3:
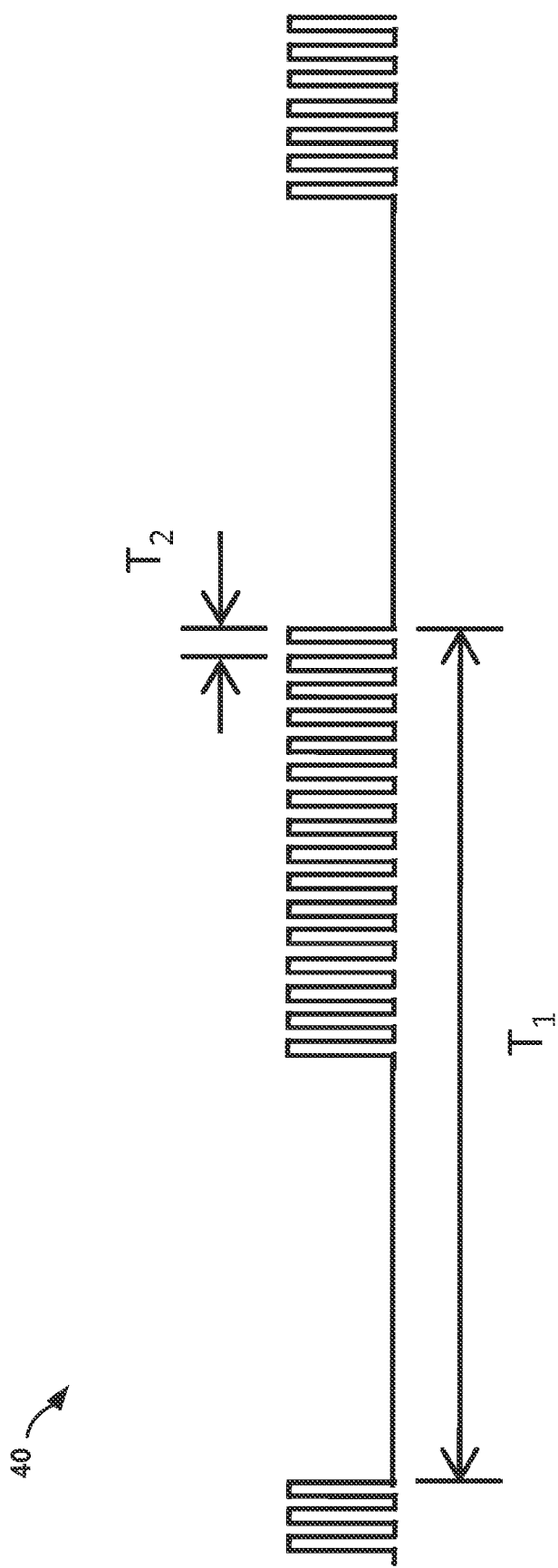
FIG. 3 is a conceptual diagram illustrating an example of a digital composite signal.

In some examples, AND gate 32 may receive and combine (e.g., the logical expression of a low logic state for any external low logic states, and provides a high logic state only when there are external high logic states) the divided digital output signals $S_1$ and $S_2$ to generate a composite digital signal, such that ratio of the values in dividers 30A and 30B cause the composite digital signal to contain a number of secondary transitions (e.g., clock edges, $T_2$ as described in FIG. 3) inside a single primary transition (e.g., $T_1$ as described in FIG. 3). In other words, because the divided digital output signal $S_2$ has a higher frequency than divided output signal $S_1$ in the digital composite signal, the digital composite signal has a number of transitions $T_2$ inside a primary transition $T_1$, as described in FIG. 3. In some examples, this combination could be a logic function (e.g., software implementing logic combinations), or a combination of one or more discrete logic gates (e.g., AND gates, OR gates, NAND gates, NOR gates, etc.).

Alternatively, the value of dividers 30A and 30B may be reversed (e.g., divider 30A may have a value of $2^7$ or $2^{10}$, and divider 30B may have a value of $2^{16}$ or $2^{30}$). In this example, AND gate 32 may receive and combine (e.g., the logical expression of a low logic state for any external low logic states, and provides a high logic state only when there are external high logic states) the divided digital output signals $S_1$ and $S_2$ to generate a composite digital signal, such that ratio of the values in dividers 30A and 30B cause the composite digital signal to contain a number of secondary transitions (e.g., clock edges, $T_2$ as described in FIG. 3) inside a single primary transition (e.g., $T_1$ as described in FIG. 3). In other words, because the divided digital output signal $S_r$ has a higher frequency than divided output signal $S_2$ the digital composite signal, the digital composite signal has a number of transitions $T_2$ inside a primary transition $T_1$, as described in FIG. 3. In some examples, this combination could be a logic function (e.g., software implementing logic combinations), or a combination of one or more discrete logic gates (e.g., AND gates, OR gates, NAND gates, NOR gates, etc.).

In some examples, the digital composite signal may be provided to a processor (e.g., processor 14 as described in FIG. 1) over link 52, and the processor determines the number of secondary transitions inside the primary transition. In other examples, the digital composite signal may be provided to a counter (not shown) over link and the counter determines the number of secondary transitions inside the primary transition. In some examples, the number of secondary transitions varies as the analog input varies. For example, an increase in the voltage at ring oscillator 26A increases the frequency of divided output signal $S_1$, and decreases the amount of secondary transitions $T_2$ from divided output signal S7 in the digital composite signal. In another example, a decrease in the voltage at ring oscillator 26A decreases the frequency of divided output signal $S_1$, and increases the amount of transitions $T_2$ from divided output signal $S_2$ in the digital composite signal.

In some examples, the number of transitions and/or the number of secondary transitions of the composite digital signal may be indicative of the analog input. In other examples, the number of transitions and/or the number of secondary transitions of the composite digital signal may be indicative of the analog input from sensor 42. In yet other examples, the number of transitions and/or the number of secondary transitions of the composite digital signal may be indicative of the amount of radiation detected by sensor 42.

FIG. 3 is a conceptual diagram illustrating an example of digital composite signal 40. FIG. 3 is described with respect to FIG. 2. In the example of FIG. 3, $T_1$ represents one primary transition, and $T_2$ represents one secondary transition (e.g., one clock edge). In this example, in the half period of $T_1$ there are a number of $T_2$ transitions. In some examples, the number of $T_2$ transitions is indicative of the analog input. For example, if the analog input (e.g., voltage with respect to radiation) increases, then the number of $T_2$ transitions will decrease as the frequency of $T_1$ increases because of a logic function, such as AND gate 32 as described in FIG. 2. In another example, if the analog input (e.g., voltage with respect to radiation) decreases, then the number of $T_2$ transitions will increase as the frequency of $T_1$ decreases because of a logic function, such as AND gate 32 as described in FIG. 2. In some examples, the number of T2 transitions may be determined by a processor (e.g., processor 14 as described in FIG. 1) or a counter and represents a digital conversion of the analog input. In some examples, digital composite signal 40 may represent a change in the number of clock edges (e.g., $T_2$) based on the analog input (e.g., voltage from sensor 42 over link 48) over time, such as analog input 54.

In some examples, an analog-to-digital converter (ADC) may have a large profile, require more power, and may have a limited resolution at the digital output. In some examples, a single ring oscillator may be exposed to external circumstances that may alter the digital output signal of the single ring oscillator, but two substantially similar oscillators, such as oscillator 44A and oscillator 44B, will affected by external circumstances in a similar manner. In some examples, the difference and/or ratio in frequencies (e.g., digital composite signal 40) between output signal $S_1$ from oscillator 44A and output signal $S_2$ from oscillator 44B, as described in FIG. 2 will provide information on the difference in voltage relative to Vcc with respect the analog input voltage, and the impact of the external circumstances will be canceled out as both oscillators 44A and 44B are similarly affected.

Figure 4:
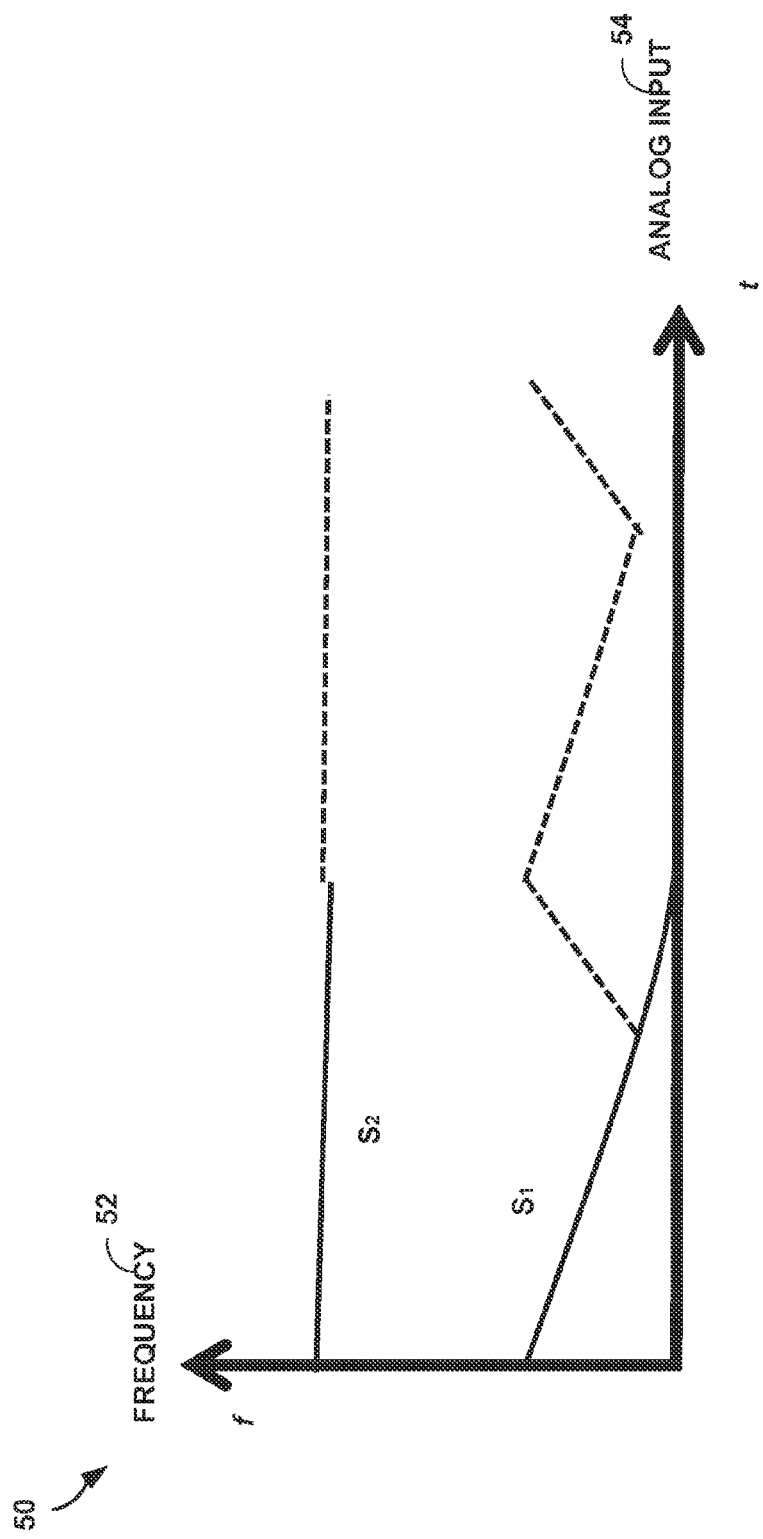
FIG. 4 is a conceptual diagram illustrating an example of the frequency of divided digital output signals based on the analog input over time.

FIG. 4 is a conceptual diagram illustrating an example 50 of the frequency of divided digital output signals $S_1$ and $S_2$ based on analog input 54 over time. FIG. 4 is described with respect to FIG. 2. In the example of FIG. 4, $S_1$ may represent the divided digital output signal generated by divider 30A with the associated frequency indicative of analog input 54 varying over time. In the example of FIG. 4, divided digital output signal $S_2$ may also represent the output signal generated by divider 30B with the associated constant frequency gradually varying over time. In one example of FIG. 4, divided digital output signal $S_1$ decreases as analog input 54 decreases, and divided digital output signal $S_1$ increases as analog input 54 increases. In another example of FIG. 4, divided digital output signal $S_2$ is substantially constant over time, as analog input 54 and digital output signal $S_1$ decrease and increase over time. In some examples, the gradual variance of divided digital output signal $S_2$ may be due to external circumstances (e.g., heat, aging, or the like). In some examples, the gradual variance of divided digital output signal $S_2$ compensates for the likely gradual variance (not shown) of divided digital output signal $S_1$. In some examples, the compensation by divided digital output signal $S_2$ for external circumstances provides fir a robust digital conversion of analog input 54 over time.

In some examples, an analog-to-digital converter (ADC) may have a large profile, require more power, and may have a limited resolution at the digital output. In some examples, a single ring oscillator may be exposed to external circumstances that may alter the digital output signal (e.g., output signal S1 may increase and/or decrease due to heat, aging, or the like) of the single ring oscillator, but two substantially similar oscillators, such as oscillator 44A and oscillator 44B, will affected by external circumstances in a similar manner. In some examples, the difference and/or ratio in frequencies between output signal $S_1$ from oscillator 44A and output signal $S_2$ from oscillator 44B will provide information on the difference in voltage relative to Vcc with respect the analog input voltage, and the impact of the external circumstances will be canceled out as both oscillators 44A and 44B are similarly affected.

Figure 5:
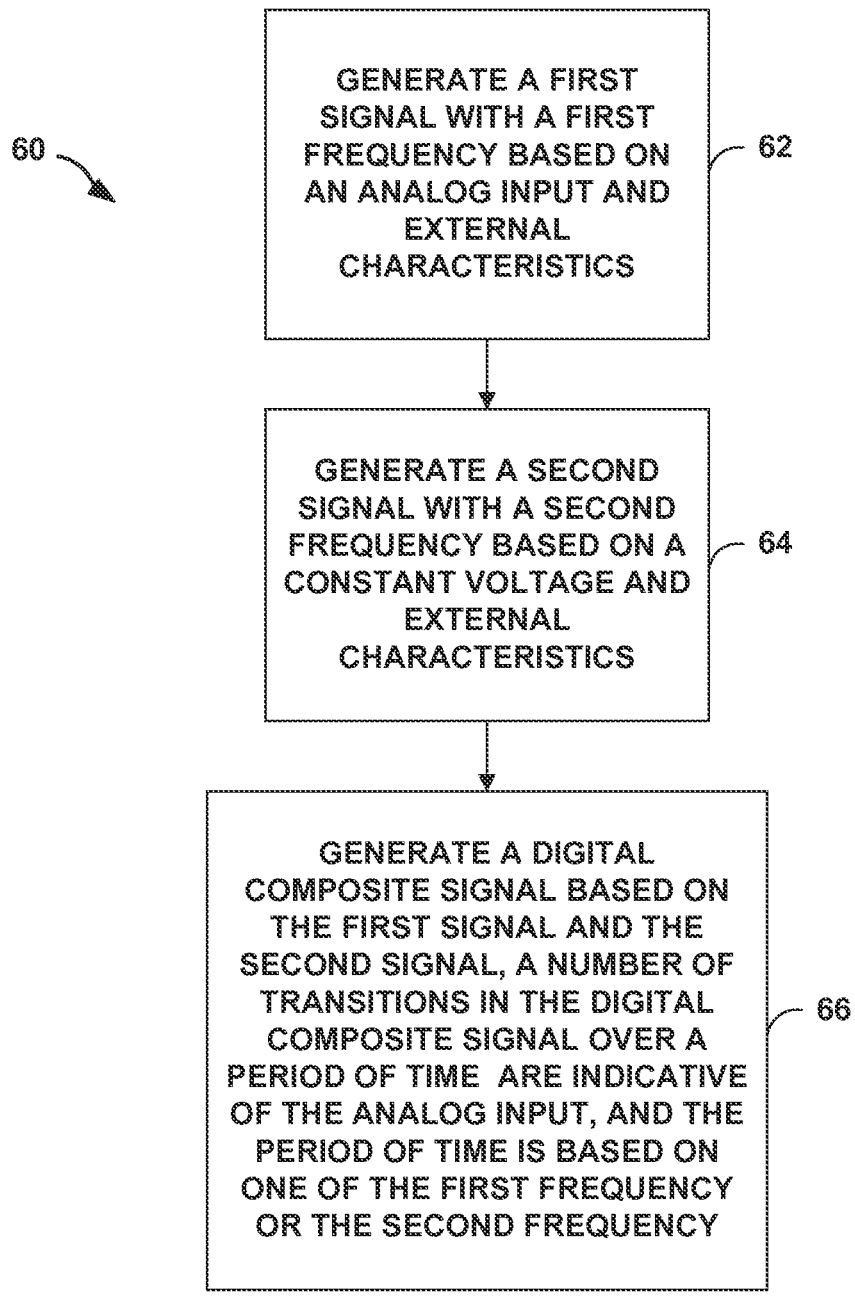
FIG. 5 is a flow chart illustrating an example of operations.

FIG. 5 is a flow chart illustrating example 60 of operations. FIG. 5 is described with respect FIG. 2. In the example of FIG. 5, a first oscillator (e.g., oscillator 44A) generates a first signal (e.g., $S_1$) with a first frequency based on an analog input (e.g., an analog input from sensor 42 over link 48) and external characteristics (62). In the example of FIG. 5, a second oscillator (e.g., oscillator 44B) generates a second signal (e.g. $S_2$) with a second frequency based on a constant voltage (e.g., Vcc) and the external characteristics (64). In the example of FIG. 5, one or more discrete logic gates generates a digital composite signal (e.g., digital composite signal 40 as described in FIG. 3) based on the first signal (e.g., $S_1$) and the second signal (e.g., $S_2$), a number of transitions (e.g., $T_2$ as described in FIG. 3) over a period of time (e.g., a half period of $T_1$ as described in FIG. 3) are indicative of the analog input, and the period of time is based on one of the first frequency of the first signal or the second frequency of the second signal (66).

In some examples, the one or more discrete logic gates may divide the first signal with the first frequency by a first divider connected to the first oscillator circuit to generate a third signal with a third frequency, divide the second signal with the second frequency by a second divider connected to the second oscillator circuit to generate a fourth signal with a fourth frequency, the one or more discrete logic gates are configured to generate the digital composite signal based on the third signal and the fourth signal, and the number of transitions in the digital composite signal over a half period of one of the third signal or the fourth signal is indicative of the analog input. In some examples, the first divider divides the digital frequency by $2^{16}$, and the second divider divides the digital reference frequency by $2^7$. In some examples, example 60 of operations may further include receiving, by a sensor connected to the first oscillator circuit, the analog input. In some examples, the first oscillator is connected to a radiation measurement component, and the analog input is indicative of the amount of radiation exposure. In some examples, the first oscillator circuit and the second oscillator circuit are located on the same silicon device. In some examples, the first oscillator circuit and the second oscillator circuit are matched ring oscillator circuits. In some examples, the period of time is a half period based on one of the first signal with the first frequency or the second signal with the second frequency.

In some examples, an analog-to-digital converter (ADC) may have a large profile, require more power, and may have a limited resolution at the digital output. In some examples, a single ring oscillator may be exposed to external circumstances that may alter the digital output signal of the single ring oscillator, but two substantially similar oscillators, such as oscillator 44A and oscillator 44B, will affected by external circumstances in a similar manner. In some examples, the difference and/or ratio in frequencies between output signal $S_1$ from oscillator 44A and output signal $S_2$ from oscillator 44B will provide information on the difference in voltage relative to Vcc with respect the analog input voltage, and the impact of the external circumstances will be canceled out as both oscillators 44A and 44B are similarly affected.

In one or more examples, the functions described may be implemented in hardware, software, firmware, or any combination thereof. If implemented in software, the functions may be stored on or transmitted over, as one or more instructions or code, a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable medium.

By way of example, and not limitation, such computer-readable storage media can comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. Also, any connection is properly termed a computer-readable medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transient media, but are instead directed to non-transient tangible storage media. Disk and disc, as used herein, includes compact disc (CD), laser disc, optical disc, digital versatile disc (DVD), floppy disk and Blu-ray disc, where disks usually reproduce data magnetically, while discs reproduce data optically with lasers. Combinations of the above should also be included within the scope of computer-readable media.

Instructions may be executed by one or more processors, such as one or more digital signal processors (DSPs), general purpose microprocessors, application specific integrated circuits (ASICs), field programmable logic arrays (FPGAs), or other equivalent integrated or discrete logic circuitry. Accordingly, the term "processor," as used herein may refer to any of the foregoing structure or any other structure suitable for implementation of the techniques described herein. In addition, in some aspects, the functionality described herein may be provided within dedicated hardware and/or software modules configured for encoding and decoding, or incorporated in a combined codec. Also, the techniques could be fully implemented in one or more circuits or logic elements.

The techniques of this disclosure may be implemented in a wide variety of devices or apparatuses, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a codec hardware unit or provided by a collection of interoperative hardware units, including one or more processors as described above, in conjunction with suitable software and/or firmware.

Various examples of the disclosure have been described. These and other examples are within the scope of the following claims.

The invention claimed is:

1. A device comprising:
    a first oscillator circuit configured to generate a first signal with a first frequency based on an analog input and external characteristics;
    a second oscillator circuit configured to generate a second signal with a second frequency based on a reference voltage and the external characteristics; and
    a converter configured to:
        generate a third signal from the first signal, the third signal having a third frequency,
        generate a fourth signal from the second signal, the fourth signal having a fourth frequency, the fourth frequency being different than the third frequency, and generate a digital composite signal based on the third signal and the fourth signal, wherein a number of transitions in the digital composite signal over a period of time are indicative of the analog input, and wherein the period of time is based on one of the third frequency of the third signal or the fourth frequency of the fourth signal.

2. The device of claim 1, wherein the converter comprises:
a first divider connected to the first oscillator circuit and configured to divide the first signal with the first frequency by a first value to generate the third signal with the third frequency;
a second divider connected to the second oscillator circuit and configured to divide the second signal with the second frequency by a second value to generate the fourth signal with the fourth frequency,
and
wherein the number of transitions in the digital composite signal over a half period of one of the third signal or the fourth signal is indicative of the analog input.

3. The device of claim 2, wherein the difference between the first value and the second value determines the number of transitions in the digital composite signal when the first frequency and the second frequency are equal.

4. The device of claim 2, wherein the first divider divides the first signal with the first frequency by $2^{16}$, and wherein the second divider divides the second signal with the second frequency by $2^7$.

5. The device of claim 1, wherein the first oscillator circuit is connected to a radiation measurement component, and wherein the analog input is indicative of an amount of radiation exposure measured by the radiation measurement component.

6. The device of claim 1, wherein the second oscillator circuit is connected to a reference voltage component.

7. The device of claim 1, wherein the period of time is a half period based on one of the third signal with the third frequency or the fourth signal with the fourth frequency.

8. The device of claim 1, wherein the first oscillator circuit and the second oscillator circuit are substantially similar.

9. The device of claim 1, wherein the first oscillator circuit and the second oscillator circuit are located on the same silicon device.

10. A method comprising:
generating, by a first oscillator circuit, a first signal with a first frequency based on an analog input and external characteristics;
generating, by a second oscillator circuit, a second signal with a second frequency based on a reference voltage and the external characteristics;
generating, by a converter, a third signal from the first signal, the third signal having a third frequency;
generating, by the converter, a fourth signal from the second signal, the fourth signal having a fourth frequency, the fourth frequency being different than the third frequency; and
generating, by the converter, a digital composite signal based on the third signal and the fourth signal, wherein a number of transitions in the digital composite signal over a period of time are indicative of the analog input, and wherein the period of time is based on one of the third frequency of the third signal or the fourth frequency of the fourth signal.

11. The method of claim 10, wherein the converter comprises:
dividing the first signal with the first frequency by a first divider connected to the first oscillator circuit to generate the third signal with the third frequency;
dividing the second signal with the second frequency by a second divider connected to the second oscillator circuit to generate the fourth signal with the fourth frequency, and
wherein the number of transitions in the digital composite signal over a half period of one of the third signal or the fourth signal is indicative of the analog input.

12. The method of claim 11, wherein dividing the first signal with the first frequency by the first divider comprises dividing the first signal with the first frequency by $2^{16}$, and wherein dividing the second signal with the second frequency by the second divider comprises dividing the second signal with the second frequency by $2^7$.

13. The method of claim 10, further comprising receiving, by a sensor connected to the first oscillator circuit, the analog input.

14. The method of claim 10, wherein the first oscillator circuit is connected to a radiation measurement component, and wherein the analog input is indicative of an amount of radiation exposure measured by the radiation measurement component.

15. The method of claim 10, wherein the first oscillator circuit and the second oscillator circuit are located on the same silicon device.

16. The method of claim 10, wherein the first oscillator circuit and the second oscillator circuit are matched ring oscillator circuits.

17. The method of claim 10, wherein the period of time is a half period based on one of the third signal with the third frequency or the fourth signal with the fourth frequency.

18. A system comprising:
a first oscillator circuit configured to generate a first signal with a first frequency based on an analog input and external characteristics;
a second oscillator circuit configured to generate a second signal with a second frequency based on a reference voltage and the external characteristics;
a converter configured to:
generate a third signal from the first signal, the third signal having a third frequency,
generate a fourth signal from the second signal, the fourth signal having a fourth frequency, the fourth frequency being different than the third frequency, and
generate a digital composite signal based on the third signal and the fourth signal, wherein a number of transitions in the digital composite signal over a period of time are indicative of the analog input, and wherein the period of time is based on one of the third frequency of the third signal or the fourth frequency of the fourth signal; and
a processor configured to determine the analog input based on the number of transitions in the digital composite signal.

19. The system of claim 18, wherein the converter comprises:
a first divider connected to the first oscillator circuit and configured to divide the first signal with the first frequency by a first value to generate the third signal with the third frequency;
a second divider connected to the second oscillator circuit and configured to divide the second signal with the second frequency by a second value to generate the fourth signal with the fourth frequency, and wherein the number of transitions in the digital composite signal over a half period of one of the third signal or the fourth signal is indicative of the analog input.

20. The system of claim 18 further comprising a sensor connected to the first oscillator circuit and configured to provide the analog input.

* * * * *